United States Patent [19]

Gray et al.

[11] Patent Number: 4,578,614

[45] Date of Patent: Mar. 25, 1986

[54] ULTRA-FAST FIELD EMITTER ARRAY VACUUM INTEGRATED CIRCUIT SWITCHING DEVICE

[75] Inventors: Henry F. Gray, Alexandria, Va.; Richard F. Greene, Bethesda, Md.

[73] Assignee: The United States of America as represented by the Secretary of the Navy, Washington, D.C.

[21] Appl. No.: 401,277

[22] Filed: Jul. 23, 1982

[51] Int. Cl.$^4$ .............................................. H01J 1/02
[52] U.S. Cl. .................. 313/309; 307/299 R; 313/250; 313/336; 313/311
[58] Field of Search ............... 313/336, 337, 633, 634, 313/309, 311, 623, 250; 307/299 R; 357/53

[56] References Cited

U.S. PATENT DOCUMENTS

| | | | |
|---|---|---|---|
| 3,463,978 | 8/1969 | Varadi | 313/311 X |
| 3,748,522 | 7/1973 | Geppert | 313/337 |
| 3,755,704 | 8/1973 | Spindt et al. | 313/309 |
| 3,921,022 | 11/1975 | Levine | 313/336 |
| 3,970,887 | 7/1976 | Smith et al. | 313/336 |
| 3,978,364 | 8/1976 | Dimeff et al. | 313/309 |
| 4,138,622 | 2/1979 | McCormick et al. | 313/309 |

*Primary Examiner*—Saxfield Chatmon
*Attorney, Agent, or Firm*—Robert F. Beers; Sol Sheinbein; Alan P. Klein

[57] ABSTRACT

A field-emitter switching device wherein a positive pulse is applied to a gate (which is held at a bias potential $V_1$ just below turn-on). A collector is held at a potential higher than the gate in order to collect emitted electrons from a field emitter source. As the voltage is applied to the gate, electrons are emitted immediately from the source and travel to the most positive potential at the collector. Because of the field emitter geometry, such electron transport is extremely fast. The ultra-fast switching speed is attained because the electrons reach near-maximum velocity within a few field tip diameters of the source.

7 Claims, 3 Drawing Figures

ULTRA-FAST FIELD EMITTER ARRAY VACUUM INTEGRATED CIRCUIT SWITCHING DEVICE

BACKGROUND OF THE INVENTION

This invention relates generally to discharge devices, and more particularly to discharge devices having an emissive cathode.

Fast switching devices in integrated circuits are customarily made with semiconductor materials as the active device medium with pn junctions and metal-oxide-semiconductor or metal-semiconductor (Schottky barrier) junctions which regulate the flow of electrons and/or holes between emitter and collector or between source and drain regions within the semiconductor.

Velocity saturation, heat dissipation, radiation effects, fluctuation phenomena, and device dimensions (e.g., gate length) provide the known basic limitations to this technology.

In contrast to such devices, in which the semiconductor constitutes the active device medium, there have also been demonstrated vacuum integrated circuits in which the active device medium is the vacuum and in which the emitter contacts are the usual thermionic cathode emitters. These vacuum integrated circuits have the following limitations: slow speed because of space charge screening; large macroscopic dimensions resulting from current requirements and ad hoc fabrication methods; running the entire device at high temperatures in order to keep the cathode emitting; and high cost and nonreproducible fabrication because silicon fabrication technology is not used.

SUMMARY OF THE INVENTION

Accordingly, it is an object of the present invention to switch on currents with high speed.

Another object is to switch on currents with high speed in radiation environments.

These and other objects of the present invention are achieved by an ultra-fast microminiature switching device which includes an electron emissive substrate; an insulating layer formed over a surface of the substrate; a field emission cathode site; a gate; a collector; and means for applying an input signal to the gate to cause emission and travel of electrons from the cathode site to the collector and for extracting an output signal from the collector. The field emission cathode site is comprised by an opening formed in the insulating layer exposing a part of the underlying substrate with the central region of the exposed underlying material forming a raised emitting tip integral with the underlying substrate. The gate is comprised by a first metallization located on the insulating layer and adjacent to the opening. The collector is comprised by a second metallization located on the insulating layer and separated from the first metallization.

The switching device is a vacuum integrated-circuit type device made with VMOS and planar semiconductor device processing technology and is based on Field Emitter Array technology. The use of vacuum rather than a solid state medium, e.g. silicon, gallium arsenide, etc. for electron transport gives one the following advantages. Semiconductor device speed is limited by electron velocity saturation to $2-5 \times 10^7$ cm/sec., whereas electron speeds in vacuum are ultimately limited to $3 \times 10$ cm.sec (the speed of light) and practically to about $10^9$ cm.sec for reasonable voltages. Heat dissipation limits the achievable packing density of semiconductor integrated circuits because of carrier generation ($\sim 250°$ C. for silicon), whereas vacuum device performance is extremely insensitive thermally. The vacuum is totally free of permanent radiation damage in contrast to semiconductor materials, and is also free of transient radiation effects (upsets and soft errors) resulting from collection of electron-hole pairs produced by the passage of fast ions, x-rays or gamma rays.

The advantages of this device when compared with transistor or FET integrated-circuits and prior art vacuum integrated circuits are as follows. Field emitter arrays as well as single integrally gridded field tips are used instead of thermionic cathodes. Ultra-fast response in switching is obtained because of short transit times. Permanent radiation damage is avoided because the active device medium is the vacuum rather than a semiconductor. Transient radiation effects (upsets and soft errors) associated with the collection of electron-hole pairs produced in semiconductors by fast ions, x-rays or gamma rays, are absent. No heater is needed (compared to thermionic vacuum integrated circuits). High packing density can be achieved (equal to VLSI). This device may operate at far higher temperatures than possible with customary semiconductor devices.

Additional advantages and features will become apparent as the subject invention becomes better understood by reference to the following detailed description when considered in conjunction with the accompanying drawings wherein:

DESCRIPTION OF THE PREFERRED EMBODIMENT

Figure 1:
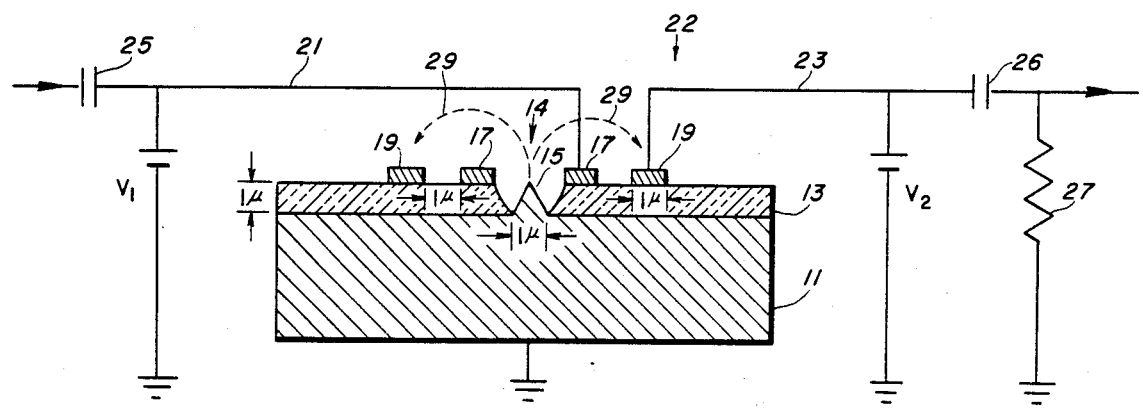
FIG. 1 is a side view, taken along line 1—1 of FIGS. 2 and 3, of a switching device built in accordance with this invention.
Figure 2:
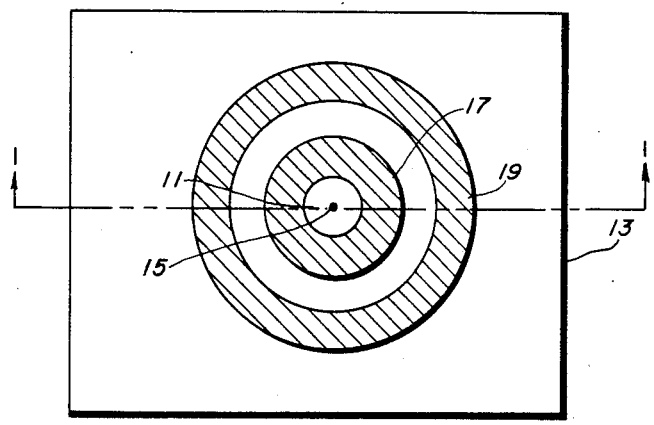
FIG. 2 depicts in top plan view one embodiment of the switching device.
Figure 3:
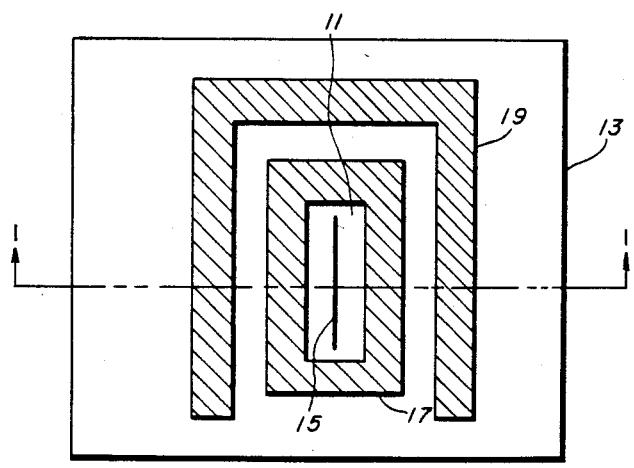
FIG. 3 depicts in top plan view another embodiment of the switching device.

Referring to FIG. 1, the ultra-fast microminiature switching device includes an electron-emissive substrate 11 of a material such as silicon, and an insulating layer 13 of a material such as $SiO_2$, $Al_2O_3$ or $Si_3N_4$ formed over the surface of the substrate. A field emission cathode site 14 is provided by an opening formed in the insulating layer 13 exposing a part of the substrate 11, with the central region of the exposed underlying material forming a raised emitting tip 15 which is integral with the underlying substrate. The field emission cathode site 14 may be formed, for example, by orientation-dependent etching, such as disclosed in commonly assigned U.S. Pat. No. 4,307,507, whose disclosure is hereby incorporated by reference, or by conventional silicon mold processing. A gate 17 is provided by a first metallization located on the insulating layer 13 around the opening; and a collector 19 is provided by a second metallization located on the insulating layer and separated from the first metallization. While the first and second metallizations may take a variety of forms, conveniently they may take the form shown in FIG. 2 of concentric ring-like structures 17 and 19, if the emitting tip 15 is point-like; or the form shown in FIG. 3 of strip-like structures 17 and 19, if the emitting tip 15 is ridge-like. The metallizations can be formed from a metal, polysilicon or other conductive material. A signal supplying-and-extracting means 22 is employed to supply an input signal to the gate 17 to cause emission and travel of electrons from the cathode site 14 to the collector 19 and to extract an output signal from the collector. While the signal supplying-and-extracting means 22 may take a variety of forms, conveniently it may take the form shown in FIG. 1 of leads 21 connecting a source of gate bias voltage $V_1$ between the gate 17 and the (grounded) substrate 11; leads 23 connecting a source of collector bias voltage $V_2$ between the collector 19 and the substrate; an input coupling capacitor 25 connected to the gate; an output coupling capacitor 26 connected to the collector; and a resistor 27 connected between the output coupling capacitor and the substrate.

In operation, the device is operated in a vacuum (for example, by enclosing it in a vacuum envelope). The gate bias voltage $V_1$ is set equal to the cut-off voltage for emission and travel of electrons from the cathode site 14 to the collector 19, and the collector bias voltage $V_2$ is set equal to a value which is higher (more positive) then the gate bias voltage $V_1$. When an input signal, such as a positive pulse, is applied by way of the input coupling capacitor 25 to the gate 17 to increase the gate's voltage with respect to the substrate 11, electrons 29 are immediately emitted and travel from the cathode site 14 to the positively-biased collector 19 and develop an output signal across the resistor 27.

Suitable dimensions for a switching device of the form shown in the drawing are as follows:

Height of insulating layer 13 1 micron
Opening in insulating layer 13 1 micron
Width of metallizations 17 and 19 1 micron
Gate 17-collector 19 separation 1 micron Because of the field emitter geometry, electron transport is extremely fast. For a device of the above dimensions, for example, transit times of the order of one picosecond can be obtained with a gate bias voltage $V_1$ of +100 volts, and a collector bias voltage $V_2$ of +500 volts. This ultra-fast switching speed is attained because the electrons 29 reach maximum velocity within a few field tip 15 diameters (about 0.1 micron for a device of the above dimensions).

The switching device has a finite gain because the power needed to switch it on is much less than the output switched power. That is, the turn-on power is low because the input impedance is very high. The output power is $i^2R$, where i is the current at the collector and R is the resistance of resistor 27. The voltage gain is $g_mR$, where $g_m$ is the transconductance of the switching device.

When a ridge-like emitting tip 15 is employed (FIG. 3), the gain of the switching device is controlled by the length of the ridge. That is, the longer the ridge, the more electrons are emitted, thereby giving greater gain.

It is obvious that many modifications and variations of the present invention are possible in light of the above teachings. For example, a plurality of switching devices can be fabricated on a single substrate by isolating each device from the other with an intervening strip, on the insulating layer, of metallization held at negative potential with respect to the substrate (−30 volts, for example when $V_1$ is +100 volts and $V_2$ is +500 volts). In this way integrated circuits of high packing density can be fabricated. It is therefore to be understood that within the scope of the appended claims, the invention may be practiced otherwise than as described.

What is claimed as new and desired to be secured by Letters Patent of the United States is:

1. An ultra-fast microminiature planar switching device comprising:
    an electron-emissive substrate;
    an insulating layer formed over a surface of the substrate;
    a field-emission cathode comprised by an opening formed in the insulating layer exposing a part of the underlying substrate, with the central region of the exposed underlying material forming a raised emitting tip integral with the underlying substrate;
    a gate electrode for control of electron extraction from the field-emission cathode comprised by a first metallization located on the insulating layer and adjacent to the opening;
    a collector electrode for collection of substantially all electron emission from the field-emission cathode comprised by a second metallization located on the insulating layer and separated from the first metallization; and
    means for supplying an input signal to the gate to cause emission and travel of electrons from the field emission cathode to the collector and for extracting an output signal from the collector.

2. The switching device recited in claim 1 wherein:
    the emitting tip is point-like; and
    the first and second metallizations are concentric ring-like structures.

3. The switching device recited in claim 1 wherein:
    the emitting tip is ridge-like.

4. The switching device recited in claim 1 wherein the signal supplying-and-extracting means includes:
    means for connecting a source of gate bias voltage $V_1$ between the gate and the substrate;
    means for connecting a source of collector bias voltage $V_2$ between the collector and the substrate, wherein the gate bias voltage $V_1$ is set equal to the cut-off voltage for emission and travel of electrons from the cathode to the collector, and the collector bias voltage $V_2$ is higher than the gate bias voltage $V_1$;
    an input coupling capacitor connected to the gate for applying the input signal to increase the potential difference of the gate with respect to the substrate and cause emission and travel of the electrons from the cathode to the collector:
    an output coupling capacitor connected to the collector; and
    a resistor connected between the output coupling capacitor and the substrate for developing an output signal.

5. The switching device recited in claim 1 wherein:
    the field emission cathode is formed by orientation-dependent etching.

6. The switching device recited in claim 1 wherein; the substrate consists essentially of silicon.

7. The switching device recited in claim 1 wherein: the insulating layer is a material selected from the group consisting of $SiO_2$, $Al_2O_3$ and $Si_3N_4$.

* * * * *